United States Patent
Sakurada et al.

(10) Patent No.: US 7,851,692 B2
(45) Date of Patent: Dec. 14, 2010

(54) THERMOELECTRIC MATERIAL, THERMOELECTRIC CONVERSION MODULE AND THERMOELECTRIC POWER GENERATING DEVICE USING THE SAME

(75) Inventors: Shinya Sakurada, Shinagawa-ku (JP); Naoki Shutoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 326 days.

(21) Appl. No.: 11/892,668

(22) Filed: Aug. 24, 2007

(65) Prior Publication Data
US 2008/0066798 A1 Mar. 20, 2008

(30) Foreign Application Priority Data
Aug. 25, 2006 (JP) .......................... P2006-228719

(51) Int. Cl.
- H01L 35/12 (2006.01)
- H01L 35/30 (2006.01)
- H01L 35/14 (2006.01)
- H01L 35/20 (2006.01)
- H01B 1/02 (2006.01)

(52) U.S. Cl. ..................... 136/236.1; 136/238; 136/239; 136/240; 136/203; 136/205; 252/519.12

(58) Field of Classification Search ............. 136/236.1, 136/238–240, 203, 205; 252/519.2
See application file for complete search history.

(56) References Cited

U.S. PATENT DOCUMENTS

| 5,917,144 | A  | * | 6/1999  | Miyake et al. | ............... 136/205 |
| 6,440,768 | B1 | * | 8/2002  | Konishi et al. | ................ 438/54 |
| 2004/0112418 | A1 | * | 6/2004  | Yang et al. | ................... 136/239 |
| 2004/0261833 | A1 | * | 12/2004 | Ono et al. | ................ 136/236.1 |
| 2005/0139251 | A1 |   | 6/2005  | Shutoh et al. | |
| 2005/0172994 | A1 | * | 8/2005  | Shutoh et al. | ................ 136/239 |
| 2005/0217715 | A1 | * | 10/2005 | Sakurada et al. | ......... 136/236.1 |

FOREIGN PATENT DOCUMENTS

| CN | 1624947 A   | 6/2005  |
| CN | 1665042 A   | 9/2005  |
| EP | 1 523 048 A2 | 10/2004 |
| EP | 1 835 551    | 9/2007  |
| JP | 2005-116746 | 4/2005  |
| JP | 2005-286228 | 10/2005 |
| WO | 2006/067986 | 6/2006  |

* cited by examiner

Primary Examiner—Alexa D Neckel
Assistant Examiner—Golam Mowla
(74) Attorney, Agent, or Firm—Nixon & Vanderhye P.C.

(57) ABSTRACT

A thermoelectric material has a composition expressed by $(Ti_p Hf_q Zr_{1-p-q})_x Co_y (Sb_{1-r} Sn_r)_{100-x-y}$ ($0.1 < p \leq 0.3$, $0.1 < q \leq 0.3$, $0.1 < r \leq 0.8$, $30 \leq x \leq 35$ atomic %, and $30 \leq y \leq 35$ atomic %), and includes a phase having an MgAgAs crystal structure as a main phase.

19 Claims, 4 Drawing Sheets

THERMOELECTRIC MATERIAL, THERMOELECTRIC CONVERSION MODULE AND THERMOELECTRIC POWER GENERATING DEVICE USING THE SAME

CROSS-REFERENCE TO THE INVENTION

This application is based upon and claims the benefit of priority from the prior Japanese Patent Application No. 2006-228719, filed on Aug. 25, 2006; the entire contents of which are incorporated herein by reference.

BACKGROUND OF THE INVENTION

1. Field of the Invention

The present invention relates to a thermoelectric material, a thermoelectric conversion module and a thermoelectric power generating device using the same.

2. Description of the Related Art

In recent years, with rising consciousness about the global environmental issues and the like, there has been growing interest in thermoelectric cooling devices using the Peltier effect, which are CFC-free refrigerators. Similarly, from the viewpoint of reduction in exhaust amount of carbon dioxide, and effective use of energy, there has been growing interest in thermoelectric power generating devices using the Seebeck effect, as a power generating system using unused waste heat energy. These thermoelectric conversion devices include a thermoelectric conversion module in which p-type and n-type thermoelectric materials are alternately connected in series.

As the thermoelectric material, a Bi—Te type single crystal or poly crystal are frequently used in the devices used at around a room temperature. When a thermoelectric conversion module is manufactured, both p-type and n-type materials are constituted of Bi—Te type materials. The n-type material is generally doped with Se. For a thermoelectric material used at a temperature higher than a room temperature, a Pb—Te type material is used because of high efficiency.

The Bi—Te type and Pb—Te type thermoelectric materials include Se (selenium), Pb (lead) and Te (tellurium) which are toxic and harmful to humans, and these are also unfavorable substances from the viewpoint of the global environmental issues. Therefore, thermoelectric materials which are substituted for Bi—Te type and Pb—Te type materials are demanded. In this respect, a material including a phase having an MgAgAs crystal structure (hereinafter, described as an MgAgAs crystal phase) as a main phase (hereinafter, called a Half-Heusler material) attracts attention (see JP-A 2005-116746 (KOKAI)).

Among Half-Heusler materials, (Ti, Hf, Zr)—Co—Sb type materials obtain high thermoelectric characteristics, and are promising as thermoelectric materials. However, the (Ti, Hf, Zr)—Co—Sb type materials include a large amount of Sb (antimony) though they hardly include Se, Pb and Te. Sb is also toxic and harmful to humans, and therefore, reduction in the use amount of Sb is demanded. Thus, reduction in Sb amount without impairment of high thermoelectric characteristics of the (Ti, Hf, Zr)—Co—Sb materials is demanded.

SUMMARY OF THE INVENTION

A thermoelectric material according to an aspect of the present invention has a composition expressed by a composition formula:

$$(Ti_pHf_qZr_{1-p-q})_xCo_y(Sb_{1-r}Sn_r)_{100-x-y} \quad (1)$$

(where, p is a value satisfying $0.1 < p \leq 0.3$, q is a value satisfying $0.1 < q \leq 0.3$, r is a value satisfying $0.1 < r \leq 0.8$, x is a value satisfying $30 \leq x \leq 35$ atomic %, and y is a value satisfying $30 \leq y \leq 35$ atomic %), and includes a phase having an MgAgAs crystal structure as a main phase.

A thermoelectric conversion module according to an aspect of the present invention includes a first electrode, a p-type thermoelectric element with one end connected to the first electrode, a second electrode connected to the other end of the p-type thermoelectric element, an n-type thermoelectric element with one end connected to the second electrode, and a third electrode connected to the other end of the n-type thermoelectric element, wherein at least one of the p-type thermoelectric element and the n-type thermoelectric element is composed of the thermoelectric material according to the aspect of the present invention.

A thermoelectric power generating device according to an aspect of the present invention includes a high-temperature portion, a low-temperature portion, and the thermoelectric conversion module according to the aspect of the present invention and disposed between the high-temperature portion and the low-temperature portion, wherein heat of the high-temperature portion is converted into electric power with the thermoelectric conversion module.

DETAILED DESCRIPTION OF THE INVENTION

Figure 1:
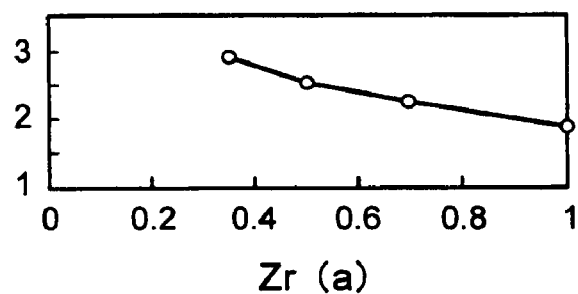
FIG. 1 is diagram showing one example of a change in an electric resistivity ρ when a Zr amount in a Co type Half-Heusler material is changed.

Hereinafter, a mode for carrying out the present invention will be described. A thermoelectric material according to an embodiment of the present invention has a composition expressed by a composition formula:

$$(Ti_pHf_qZr_{1-p-q})_xCo_y(Sb_{1-r}Sn_r)_{100-x-y} \quad (1)$$

(where, p is a value satisfying $0.1 < p \leq 0.3$, q is a value satisfying $0.1 < q \leq 0.3$, r is a value satisfying $0.1 < r \leq 0.8$, x is a value satisfying $30 \leq x \leq 35$ atomic %, and y is a value satisfying $30 \leq y \leq 35$ atomic %), and includes an MgAgAs crystal phase as a main phase.

A figure of merit Z of the thermoelectric material is expressed by $$Z = \alpha^2/(\rho \cdot \kappa) \quad (2)$$

(where, α represents a Seebeck coefficient of a thermoelectric material, ρ represents an electric resistivity of a thermoelectric material and κ represents a thermal conductivity of a thermoelectric material).

The figure of merit Z expressed by the formula (2) has the dimension of the inverse number of the temperature, and when the figure of merit Z is multiplied by the absolute temperature T, a dimensionless value is obtained. The value ZT is called a dimensionless figure of merit, and has correlation with thermoelectric conversion efficiency of the thermoelectric material The material with a larger ZT value has higher thermoelectric conversion efficiency. As is understood from the formula (2), in order to realize the thermoelectric material having a large ZT value, a higher Seebeck coefficient α, a lower electric resistivity ρ and a lower thermal conductivity κ are demanded.

As one of the thermoelectric materials which do not include Se, Pb and Te, a thermoelectric material including an MgAgAs crystal phase (Half-Heusler phase) as a main phase attracts attention. A Half-Heusler compound is expressed by a chemical formula ABX, and has an MgAgAs crystal structure of a cubic crystal system. The MgAgAs crystal structure has the structure in which atoms B are inserted into NaCl type crystal lattice by atoms A and atoms X. A Half-Heusler compound using Co as the B site atoms (Co type Half-Heusler compound) can be enhanced in thermoelectric characteristics due to increase in the Seebeck coefficient, but on the other hand, Sb is indispensable as the X site atoms in enhancing thermoelectric characteristics by adjusting the number of valence electrons per one atom to a value close to 6.

Since Sb is toxic and harmful as Se, Pb, Te and the like, reduction in its use amount is demanded. In this respect, by optimizing the ratio of Ti, Zr and Hf which are A site atoms, high thermoelectric characteristics can be obtained even if a part of Sb (more than 10 atomic % to 80 atomic % inclusive) is replaced by harmless Sn. In addition to reducing the content of Sb which is a harmful substance, the thermoelectric material which can obtain excellent thermoelectric characteristics can be provided.

The thermoelectric material (Co type Half-Heusler material) of this embodiment will be described in detail. In the thermoelectric material of this embodiment, the MgAgAs crystal phase (Half-Heusler phase) is a phase carrying the thermoelectric characteristics, and this is contained as a main phase. The main phase means a phase having the largest volume occupancy ratio with respect to the total amount of all the crystal phases and non-crystal phases constituting the thermoelectric material. By adopting the Half-Heusler phase as the main phase, high thermoelectric characteristics can be obtained.

On realizing the Co type Half-Heusler material having a Half-Heusler phase as the main phase, the values of x and y in the formula (1) are set in the range of 30 to 35 atomic %. If the total amount of (Ti, Zr, Hf) expressed by x and the Co amount expressed by y deviate the above described range, the precipitation amount of the phases other than the Half-Heusler phase becomes large, and the thermoelectric characteristics, especially, the Seebeck coefficient α reduces. The values of x and y are more preferably set in the range of 33 to 34 atomic %.

On maintaining the thermoelectric characteristics of the Co type Half-Heusler material in which a part of Sb is replaced by Sn, it is important to optimize the ratio of Ti, Zr and Hf. In this embodiment, the value p expressing the Ti amount and the value q expressing the Hf amount are respectively set in the range larger than 0.1 and 0.3 or less ($0.1 < p \leq 0.3$, $0.1 < q \leq 0.3$) respectively.

In other words, the composition (Zr-rich composition) in which the amount of Zr is in the range of 0.4 or more and less than 0.8 ($0.4 \leq$ Zr amount $(1-p-q) < 0.8$) is applied. By applying the Zr-rich composition, reduction in the thermoelectric characteristics, especially, the Seebeck coefficient α of the Co type Half-Heusler material in which a part of Sb is replaced by an effective amount of Sn can be suppressed.

When a part of Sb of the Co type Half-Heusler material is replaced by Sn, the electric resistivity ρ of the Half-Heusler material reduces. Though reduction in the electric resistivity ρ contributes to enhancement in thermoelectric characteristics, the Seebeck coefficient α also reduces with the electric resistivity ρ, and therefore, reduction in characteristics becomes large when considering the ZT value. When the composition ratio of Ti, Zr and Hf is shifted to the Zr rich side, the electric resistivity ρ reduces, but reduction in the Seebeck coefficient can be suppressed by optimizing the composition ratio of Ti, Zr and Hf.

As such a composition ratio of Ti, Zr and Hf, the composition ratio of $0.1 <$ Ti amount (p) $\leq 0.3$, $0.1 <$ Hf amount (q) $\leq 0.3$, $0.4 \leq$ Zr amount $(1-p-q) < 0.8$ is applied. When the value p expressing the Ti amount and the value q expressing the Hf amount exceed 0.3, in otherwords, if the Zr amount is less than 0.4, the effect of suppressing reduction in the Seebeck coefficient α based on the Zr-rich composition cannot be obtained. If the value p and the value q are 0.1 or less, in otherwords, if the Zr amount is 0.8 or more, reduction in the Seebeck coefficient α becomes large in addition to reduction in the electric resistivity ρ.

It is preferable that the Zr amount is set in the range of 0.4 to 0.6, the Ti amount (p) is set in the range of 0.2 to 0.3 and the Hf amount (q) is set in the range of 0.2 to 0.3. By applying the composition ratio of Ti, Zr and Hf like this, favorable thermoelectric characteristics can be obtained based on the effect of reducing the electric resistivity ρ and the effect of suppressing reduction in the Seebeck coefficient α.

Figure 2:
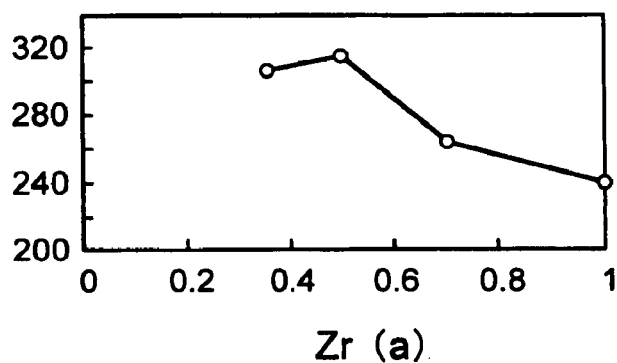
FIG. 2 is a diagram showing one example of a change in a Seebeck coefficient α when the Zr amount in the Co type Half-Heusler material is changed.
Figure 3:
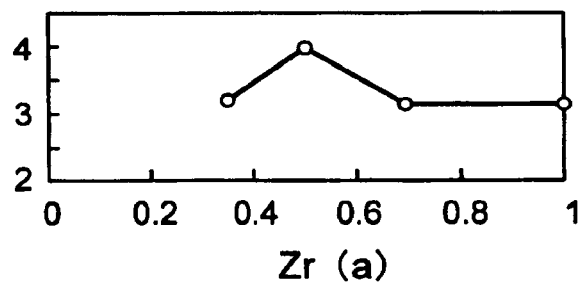
FIG. 3 is a diagram showing one example of a change in a power factor when the Zr amount in the Co type Half-Heusler material is changed.

FIGS. 1, 2 and 3 show the changes in the electric resistivity ρ and the Seebeck coefficient α at 700 K and the change in the output factor ($=\alpha^2/\rho$) by them, when the value a expressing the Zr amount is changed in the Co type Half-Heusler material of the composition of $[\{(Ti_{0.5}Hf_{0.5})_{1-a}Zr_a\}_xCo_y(Sb_{1-r}Sn_r)_{100-x-y}]$. The value x is fixed at 33 atomic %, the value y is fixed at 33 atomic % and the value r is fixed at 0.15.

As is obvious from FIGS. 1 to 3, by setting the value a showing the Zr amount in the range of 0.4 to 0.8 (especially in the range of 0.4 to 0.6), the electric resistivity ρ can be reduced while reduction in the Seebeck coefficient α is suppressed. Accordingly, the power factor ($=\alpha^2/\rho$) which influences the thermoelectric characteristics can be kept high. Specifically, favorable thermoelectric characteristics can be obtained with the Co type Half-Heusler material in which a part of Sb is replaced by an effective amount of Sn.

In the thermoelectric material of this embodiment, a part of harmful Sb is replaced by harmless and low-cost Sn. The value r which expresses the substitution amount with Sn is set in the range from over 0.1 to 0.8 inclusive. If the substitution amount r of Sn for Sb is not larger than 0.1, the effect of substituting Sn for Sb (effect of reducing the harmful substance, effect of reducing cost and the like) cannot be obtained sufficiently. Further, the effect of reducing the electric resistivity ρ of the thermoelectric material becomes insufficient.

If the substitution amount r of Sn exceeds 0.8, the number of valence electrons per one atom deviates from 6, and therefore, the characteristics as the thermoelectric material having the Half-Heusler phase as the main phase cannot be obtained sufficiently. The substitution amount r of Sn is preferably in the range of 0.5 or less for making retention of the thermoelectric characteristics and effect of reducing the harmful substance compatible. In order to obtain favorable thermoelectric characteristics of the Co type Half-Heusler material with favorable repeatability, it is preferable to set the substitution amount r in the range of 0.3 or less. The substitution amount r is preferably set in the range of $0.1 < r \leq 0.5$. From the viewpoint of the thermoelectric characteristics, the substitution amount r is more preferably set in the range of $0.1 < r \leq 0.3$.

The number of valence electrons per one atom is calculated as follows. In the compound, each of Ti, Zr and Hf has four valence electrons, Co has nine valence electrons, and Sb has five valence electrons. In the case of $(Ti, Hf, Zr)_{33}CO_{33}Sb_{34}$, the number of valence electrons per one atom is $4 \times 0.33 + 9 \times 0.33 + 5 \times 0.34 = 5.990$. Sn has four valence electrons. In the case of $(Ti, Hf, Zr)_{33}CO_{33}(Sb_{0.15}Sn_{0.85})_{34}$, the number of valence electrons per one atom of is $4 \times 0.33 + 9 \times 0.33 + (5 \times 0.15 + 4 \times 0.85) \times 0.34 = 5.701$. The number of valence electrons per one atom is preferably adjusted to be in the range of 5.85 to 6.15. If the number of valence electrons per one atom deviates from this range, favorable thermoelectric characteristics are difficult to obtain.

In the Co type Half-Heusler material in which a part of Sb is replaced by Sn, reduction in the Seebeck coefficient α can be suppressed by applying the Zr-rich composition ratio while keeping the composition of Ti and Hf in the proper range. Accordingly, the thermoelectric characteristics of the Co type Half-Heusler material in which a part of Sb is replaced by Sn can be enhanced based on the effect of reducing the electric resistivity ρ and the effect of suppressing reduction in the Seebeck coefficient α. Specifically, favorable thermoelectric characteristics can be obtained in the Co type Half-Heusler material in which a part of harmful Sb is replaced by harmless and low-cost Sn.

Further, in the Half-Heusler material having the composition expressed by the formula (1), a part of Ti, Zr and Hf may be replaced by at least one of element M selected from V, Nb, Ta, Cr, Mo, W, Sc, Y, U and lanthanoid element. Thereby, the effect of reducing thermal conductivity and electric resistivity of the thermoelectric material and the effect of increasing the Seebeck coefficient can be obtained. As the element M, at least one of element selected from V, Nb, Ta, Cr, Mo, W, Y and lanthanoid element is effective.

Substitution of the element M exhibits an effect even by small amount, but in order to obtain more remarkable effect, the element M is preferably substituted for 0.1 atomic % or more of the total amount of Ti, Zi and Hf. However, excessive substitution reduces the Seebeck coefficient, and therefore, the substitution amount of the element M is preferably set to be 20 atomic % or less of the total amount of Ti, Zr and Hf. The element M is preferably at least one selected from V, Nb, Mo, W, Y and lanthanoid element.

A part of Co may be replaced by at least one of element T selected from Mn, Fe, Ni, Cu, Ag, Pd, Pt, Ru and Os. Thereby, the effect of reducing thermal conductivity and electric resistivity of the thermoelectric material and the effect of increasing the Seebeck coefficient can be obtained. As the element T, at least one of element selected from Mn, Fe, Ni, Cu and Ag is effective.

Substitution of the element T exhibits an effect even by a small amount, but in order to obtain a more remarkable effect, the element T is preferably substituted for 0.1 atomic % or more of Co. However, excessive substitution amount of the element T for Co reduces the Seebeck coefficient, and therefore, the substitution amount of the element T is preferably set to be 20 atomic % or less of Co.

A part of the total amount of Sb and Sn may be replaced by at least one of element X selected from Bi, Pb, Se, Te and Ge. Thereby, the effect of reducing thermal conductivity and electric resistivity of the thermoelectric material and the effect of increasing the Seebeck coefficient can be obtained. From the viewpoint of preventing the thermoelectric material from including a toxic element as much as possible, at least one of element selected from Bi and Ge is preferably used as the element X.

Substitution of the element X exhibits an effect even by a small amount, but in order to obtain more remarkable effect, the element X is preferably substituted for 0.1 atomic % or more of the total amount of Sb and Sn. However, excessive substitution of the element X reduces the Seebeck coefficient, and therefore, the substitution amount of the element X is preferably set to be 50 atomic % or less of the total amount of Sb and Sn.

The thermoelectric material of this embodiment is produced as follows. First, an alloy containing a predetermined amount of each element is produced by an arc melting method and a high frequency melting method. On producing the alloy, a rapidly quenching method such as a single roll method, a twin roll method, a rotary disk method and a gas atomizing method, and a method using a solid phase reaction such as a mechanical alloying method may be adopted. The rapidly quenching method and the mechanical alloying method are advantageous in the respects of miniaturization of the crystal phase constituting an alloy, enlargement of the solution region of the elements into the crystal phase and the like. By them, the thermal conductivity of the thermoelectric material can be reduced.

An alloy can be produced by hot-pressing raw material metallic powders without going through the melting process as described above. Heat treatment is applied to the alloy produced by hot pressing in accordance with necessity. By the heat treatment, the phases other than the MgAgAs crystal phase can be reduced and the crystal grain size can be controlled. Each of the processes of melting, rapidly quenching, mechanical alloying, heat treatment and the like is preferably performed in an inert atmosphere such as Ar, from the viewpoint of prevention of oxidation of the alloy.

Next, the alloy is crushed by a ball mill, a brown mill, a stamp mill or the like and alloy powders are produced. The alloy powders are integrated (molded) by applying a sintering method, a hot pressing method, a spark plasma sintering method or the like. From the viewpoint of prevention of oxidation of the alloy, the molding process is preferably carried out in an inert atmosphere such as Ar. Thereafter, the molded body is machined into a desired size, and thereby, the thermoelectric material of the embodiment can be obtained. The shape and size of the molded body can be properly selected. For example, the molded body can be formed into, for example, a circular cylindrical body of an outer diameter of 0.5 to 10 mm by a thickness of 1 to 30 mm, and a rectangular parallelepiped of 0.5 to 10 mm by 0.5 to 10 mm by a thickness of 1 to 30 mm.

Next, an embodiment of a thermoelectric conversion module of the present invention will be described. A thermoelectric conversion module 10 shown in FIG. 4 has a p-type thermoelectric element 11 constituted of a p-type thermoelectric material which is a p-type semiconductor, and an n-type thermoelectric element 12 constituted of an n-type thermoelectric material which is an n-type semiconductor. The thermoelectric material of the embodiment is applied to at least one of the p-type and n-type thermoelectric elements 11 and 12.

The thermoelectric material having the composition expressed by the formula (1) is especially suitable for the p-type thermoelectric element 11. When the thermoelectric material of this embodiment is applied to only one of the p-type and n-type thermoelectric elements 11 and 12 (for example, the p-type thermoelectric element 11), the other one (for example, the n-type thermoelectric element 12) may be constituted of a (Ti, Zr, Hf)—Ni—Sn type Half-Heusler material, or a Bi—Te type or Pb—Te type thermoelectric material. From the viewpoint of reduction of the harmful element, both the p-type and n-type thermoelectric elements 11 and 12 are preferably constituted of the Half-Heusler material.

The p-type and n-type thermoelectric elements 11 and 12 are arranged in parallel. An upper end portion of the p-type thermoelectric element 11 is electrically and mechanically connected to a first electrode 13A. An upper end portion of the n-type thermoelectric element 12 is electrically and mechanically connected to a third electrode 13B. An upper insulating substrate 14 is disposed on the outer sides of the first and the third electrodes 13A and 13B. Lower end portions of the p-type and n-type thermoelectric materials 11 and 12 are electrically and mechanically connected to a second electrode 15, respectively. The second electrode 15 is supported by a lower insulating substrate 16.

The p-type and n-type thermoelectric elements 11 and 12 are connected in series with the first, the second and the third electrodes 13A, 15 and 13B. The electrodes 13A, 15 and 13B are preferably constituted of a metal material having at least one selected from, for example, Cu, Ag and Fe as a main constituent. For the insulating substrates 14 and 16, insulating ceramics substrates are applied. The insulating substrates 14 and 16 are preferably constituted of ceramics substrates constituted of a sintered material having at least one selected from aluminum nitride, silicon nitride, alumina and magnesia as a main constituent.

The thermoelectric conversion module 10 gives a temperature difference between the upper and lower insulating substrates 14 and 16, and makes, for example, the upper insulating substrate 14 the low temperature side and the lower insulating substrate 16 the high temperature side. When such a temperature difference is given, a hall 17 having a positive electric charge moves to the lower temperature side inside the p-type thermoelectric element 11, and the first electrode 13A is at higher potential than the second electrode 15. An electron 18 having a negative electric charge moves to the lower temperature side inside the n-type thermoelectric element 12, and the second electrode 15 is at higher potential than the third electrode 13B. As a result, a potential difference occurs between the first electrode 13A and the third electrode 13B, and if a load is connected to the terminal of the electrode, for example, electric power can be taken out. On this occasion, the first electrode 13A becomes a positive electrode, whereas the third electrode 13B becomes a negative electrode.

Figure 4:
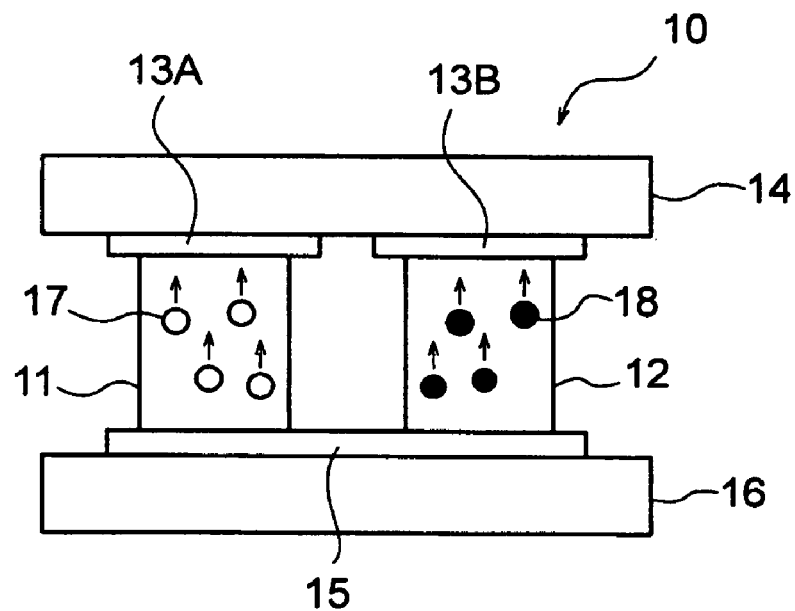
FIG. 4 is a view showing a basic structure of a thermoelectric conversion module according to an embodiment.
Figure 5:
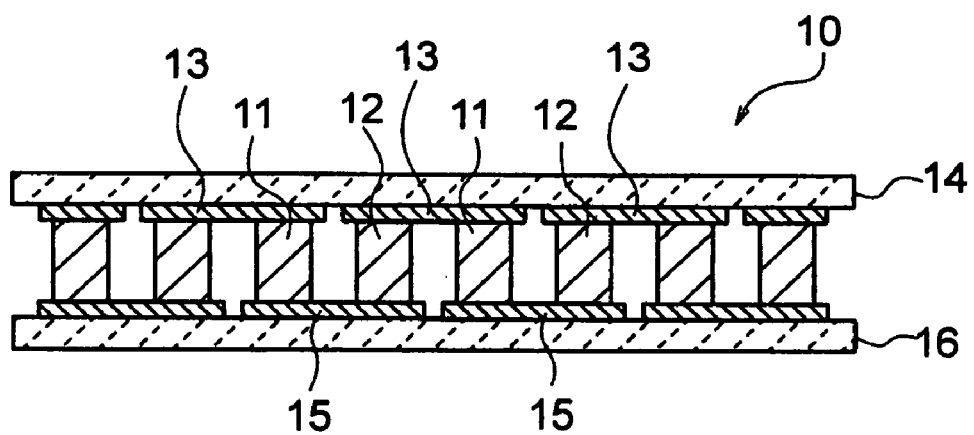
FIG. 5 is a sectional view showing a constitution of the thermoelectric conversion module according to the embodiment.

A practical structure of the thermoelectric conversion module 10 is shown in FIG. 5. In the thermoelectric conversion module 10 shown in FIG. 5, a plurality of p-type thermoelectric elements 11, 11 . . . , and a plurality of n-type thermoelectric elements 12, 12 . . . are alternately disposed, and the respective elements 11 and 12 are connected in series with the first and the third electrodes 13 and the second electrodes 15. In FIG. 5, the first electrode and the third electrode are collectively designated by reference numeral 13. By applying such a structure, a higher voltage than the structure shown in FIG. 4 is obtained. Accordingly, by applying the thermoelectric conversion module 10 shown in FIG. 5 to a thermoelectric power generating device, larger electric power can be obtained.

The thermoelectric conversion module 10 of the embodiment described above is not limited for the purpose of power generation in which heat is converted into electric power, but can also be used for the purpose of heating or cooling in which electricity is converted into heat. Specifically, when a DC current is passed between the p-type thermoelectric element 11 and the n-type thermoelectric element 12 connected in series, heat release occurs at one of the insulating substrate sides, and heat absorption occurs at the other insulating substrate side. Accordingly, by disposing a processing target on the insulating substrate on the heat release side, the processing target can be heated. Alternatively, by disposing a processing target on the insulating substrate on the heat absorption side, the processing target can be deprived of heat and cooled.

Figure 6:
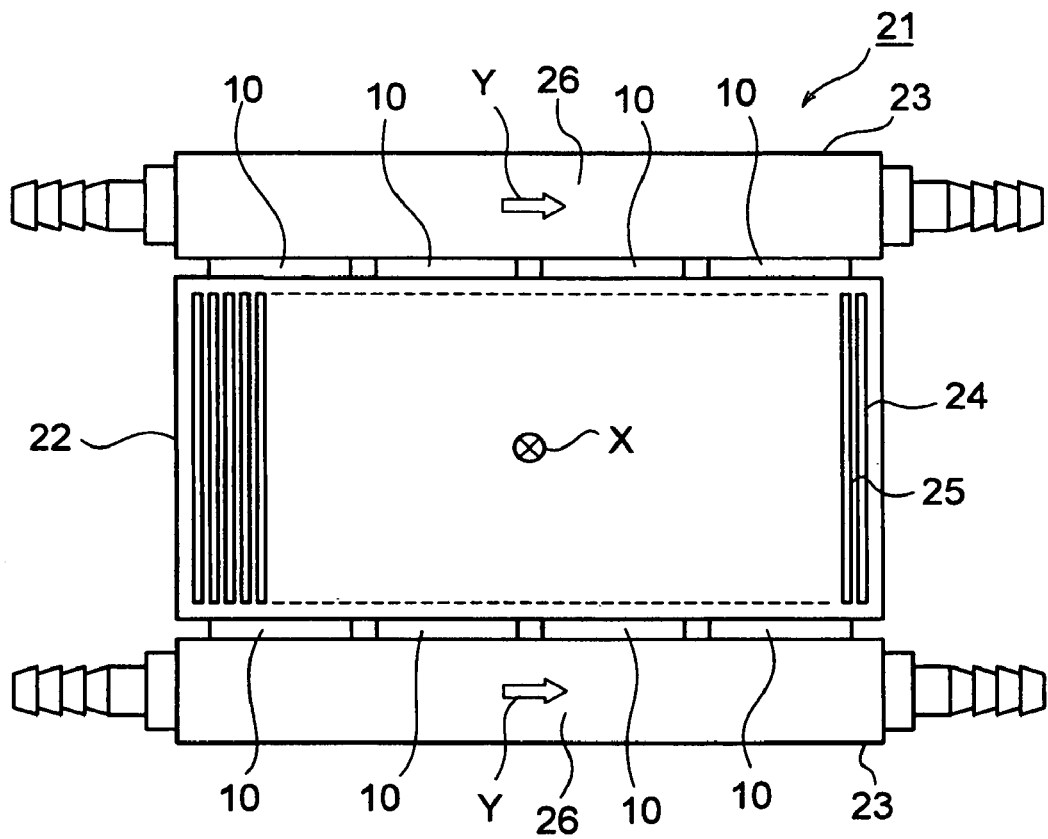
FIG. 6 is a plane view showing a constitution of a thermoelectric power generating device according to an embodiment.
Figure 7:
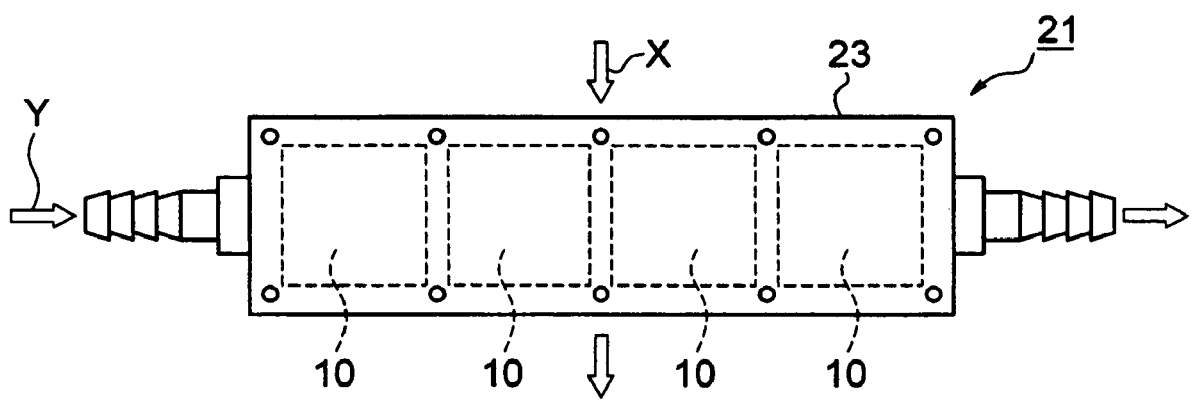
FIG. 7 is a side view of FIG. 6.

Next, an embodiment of a thermoelectric power generating device of the present invention will be described. A thermoelectric power generating device 21 shown in FIGS. 6 and 7 includes a high-temperature portion 22 having a flow path for a high-temperature fluid, and a low-temperature portion 23 having a flow path for a cooling medium. The high-temperature portion 22 has a flow path 25 partitioned by a number of fins 24 so that a high-temperature fluid is passed in the direction of, for example, the arrow X (in the direction perpendicular to the paper surface of FIG. 6). As the high-temperature fluid, for example, high-temperature exhaust gas exhausted from a combustion furnace such as a garbage furnace, exhaust gas from an internal-combustion type engine represented by an automobile engine, high-temperature water flowing in an internal water pipe of a boiler and the like are used.

The low-temperature portion 23 has a flow path 26 in which a cooling medium such as cooling water is passed in the direction of an arrow Y, for example. The flow paths 26 in which a cooling medium is passed are provided at both ends of the high-temperature portion 22. The high-temperature portion 22 is heated based on the temperature of the high-temperature fluid flowing in the flow path 25. The low-temperature portion 23 is cooled based on the cooling medium flowing in the flow paths 26. The temperature difference between the high-temperature portion 22 and the low temperature portion 23 is not especially limited, but is preferably set at 300° C. or more for enhancing power generation efficiency.

The thermoelectric conversion module 10 shown in FIG. 5 is disposed between the high-temperature portion 22 and the low-temperature portion 23. Four thermoelectric conversion modules 10 are disposed between the high-temperature portion 22 and the low-temperature portion 23. The thermoelectric power generating device 21 has eight thermoelectric conversion modules 10 in total. When the upper insulating substrate 14 of the thermoelectric conversion module 10 is made the low temperature side, and the lower insulating substrate 16 is made the high temperature side, the upper insulating substrate 14 is disposed so as to be in contact with the flow path 26 of the low-temperature portion 23, and the lower insulating substrate 16 is disposed so as to be in contact with the fins 24 of the high-temperature portion 22.

In the thermoelectric power generating device 21, the high-temperature fluid is introduced into the flow path 25 of the high-temperature portion 22, and at the same time, the cooling medium is passed into the flow path 26 of the low-temperature portion 23. Thereby, a temperature difference occurs to both ends of each of the thermoelectric conversion modules 10. Based on such a temperature difference, electric power is taken out from each of the thermoelectric conversion modules 10. The thermoelectric power generating device 21 is a generating device which converts the heat of the high-temperature fluid flowing in the flow path 25 of the high-temperature portion 22 into electric power with the thermo-electric modules 10 and takes out the electric power.

Next, concrete examples of the present invention and the evaluation results of them will be described.

EXAMPLE 1

A predetermined amount of each raw material was weighed to achieve the composition of $(Ti_{0.25}Hf_{0.25}Zr_{0.5})_{33}CO_{33}(Sb_{0.85}Sn_{0.15})_{34}$, and this was subjected to arc melting and the mother alloy was produced. The mother alloy was pulverized into a particle size of 45 μm or less with the mortar. Next, the alloy powder was hot-pressed under the conditions of 1350° C.×1 hour, and the molded body of an outer diameter of 15 mm and a thickness of 3 mm (thermoelectric material) was produced. The chip in a desired shape was cut out from the molded body and was provided for evaluation of the thermoelectric characteristics. As a result of providing the remaining part to the powder X-ray diffraction and examining the generated phase, the diffraction peak mainly derived from the MgAgAs crystal phase was observed.

EXAMPLES 2 TO 11

Predetermined amounts of the respective materials were weighed to achieve the compositions shown in Table 1, respectively, and they were subjected to arc melting and the mother alloys were produced. Each of these mother alloys was pulverized into a particle size of 45 μm or less with the mortar. Next, the respective alloy powders were hot-pressed under the condition of 1350° C.×1 hour, and respective molded bodies each of an outer diameter of 15 mm and a thickness of 3 mm (thermoelectric materials) were produced. The chip in a desired shaped was cut out from each of these molded bodies and was provided for evaluation of the thermoelectric characteristics. As a result of providing each remaining part to the powder X-ray diffraction and examining the generated phase, the diffraction peak mainly derived from the MgAgAs crystal phase was observed in each of them.

COMPARATIVE EXAMPLE 1

The thermoelectric material was produced similarly to the example 1 except that the composition of $(Ti_{0.3}Hf_{0.35}Zr_{0.35})_{33}CO_{33}Sb_{34}$ was applied. The chip in a desired shape was cut out from the molded body and was provided for evaluation of the thermoelectric characteristics. As a result of providing the remaining part to the powder X-ray diffraction and examining the generated phase, the diffraction peak mainly derived from the MgAgAs crystal phase was observed.

COMPARATIVE EXAMPLE 2

The composition $((Ti_{0.3}Hf_{0.35}Zr_{0.35})_{33}CO_{33}(Sb_{0.97}Sn_{0.03})_{34})$ which was the result of substituting Sn for 3 atomic % of Sb of the alloy composition according to the comparative example 1 was applied, and the thermoelectric material was produced similarly to the comparative example 1 except for the composition. The chip in a desired shaped was cut out from the molded body and was provided for evaluation of the thermoelectric characteristics. As a result of providing the remaining part to the powder X-ray diffraction and examining the generated phase, the diffraction peak mainly derived from the MgAgAs crystal phase was observed.

COMPARATIVE EXAMPLE 3

The composition $((Ti_{0.3}Hf_{0.35}Zr_{0.35})_{33}CO_{33}(Sb_{0.85}Sn_{0.15})_{34})$ which was the result of substituting Sn for 15 atomic % of Sb of the alloy composition according to the comparative example 1 was applied, and the thermoelectric material was produced similarly to the comparative example 1 except for the composition. The chip in a desired shape was cut out from the molded body and was provided for evaluation of the thermoelectric characteristics. As a result of providing the remaining part for the powder X-ray diffraction and examining the generated phase, the diffraction peak mainly derived from the MgAgAs crystal phase was observed.

COMPARATIVE EXAMPLE 4

The composition $((Ti_{0.25}Hf_{0.25}Zr_{0.5})_{33}CO_{33}Sb_{34})$ which was the result of making the composition of (Ti, Hf, Zr) of the alloy according to the comparative example 1 $(Ti_{0.25}Hf_{0.25}Zr_{0.5})$ was applied, and the thermoelectric material was produced similarly to the comparative example 1 except for the composition. The chip in a desired shape was cut out from the molded body and was provided for evaluation of the thermoelectric characteristics. As a result of providing the remaining part for the powder X-ray diffraction and examining the generated phase, the diffraction peak mainly derived from the MgAgAs crystal phase was observed.

COMPARATIVE EXAMPLE 5

The composition $((Ti_{0.25}Hf_{0.25}Zr_{0.5})_{33}CO_{33}(Sb_{0.15}Sn_{0.85})_{34})$ which was the result of substituting Sn for 85 atomic % of Sb of the alloy composition according to the comparative example 4 was applied, and the thermoelectric material was produced similarly to the comparative example 1 except for the composition. The chip in a desired shape was cut out from the molded body and was provided for evaluation of the thermoelectric characteristics. As a result of providing the remaining part for the powder X-ray diffraction and examining the generated phase, the diffraction peak mainly derived from the MgAgAs crystal phase was observed.

The thermoelectric characteristics of the thermoelectric materials of the examples 1 to 11 and the comparative examples 1 to 5 were measured and evaluated as follows. The thermal diffusivity of each of the thermoelectric materials was measured by a laser flash method, the density was measured by an Archimedean method, the specific heat was measured by a DSC (differential scanning calorimetry) method, respectively. The thermal conductivity κ was obtained from these results. The electric resistivity ρ of each of the thermoelectric materials was measured by a four probes method. Further, each of the thermoelectric materials was cut into a needle shape, and the Seebeck coefficient α was measured.

Figure 8:
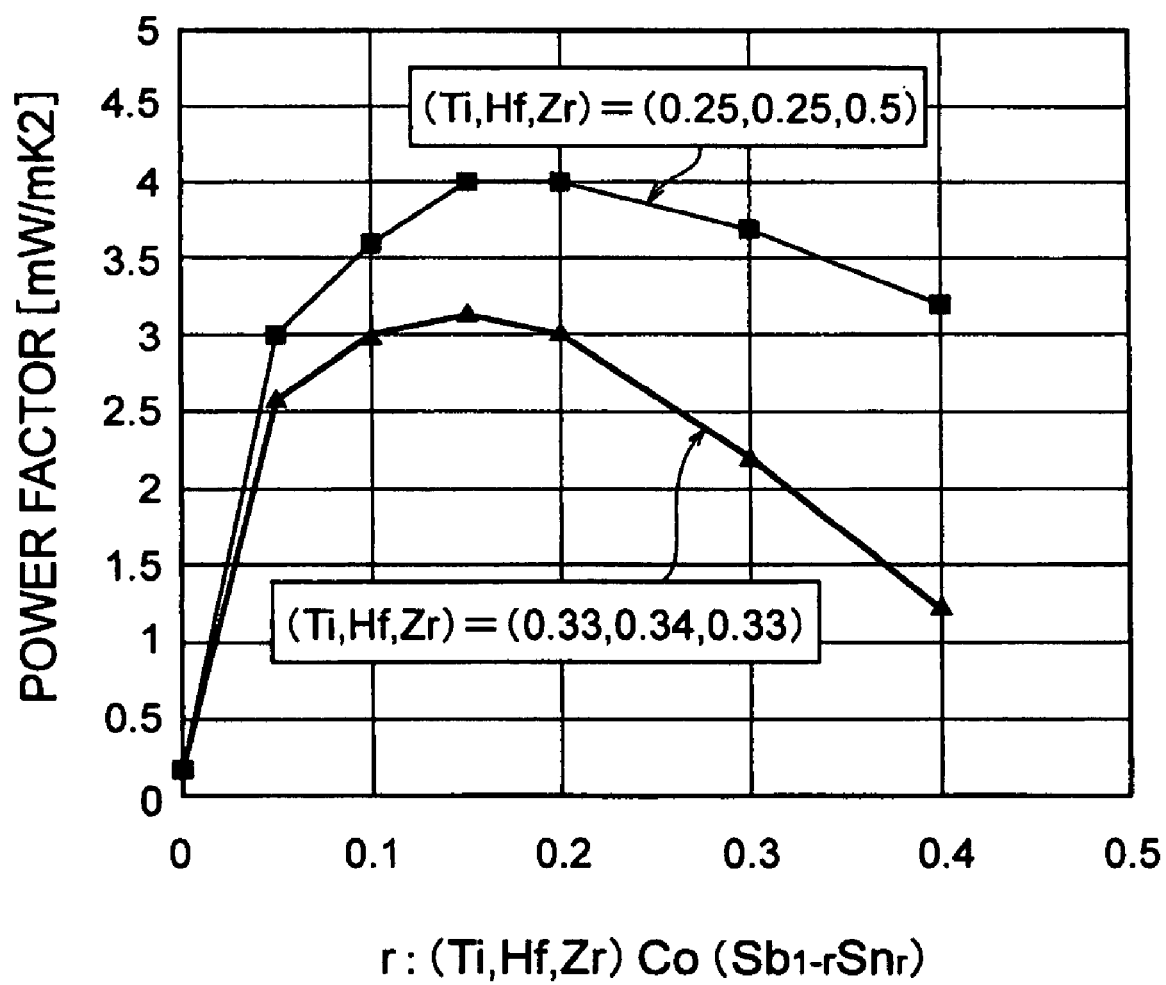
FIG. 8 is a diagram showing a change in a power factor when a substitution amount of Sb by Sn of the thermoelectric material is changed according to an example.

From the measurement results of the heat conductivity κ, the electric resistivity ρ and the Seebeck coefficient α at T=700 K of each of the specimens, the power factor $P(P=\alpha^2/\rho)$ was obtained. These values are shown in Table 2. The heat conductivities at 700 K were in the range of 2.3 to 3.3 W/m·K in all the specimens. The dimensionless figure of merit ZT is expressed by $ZT=\alpha^2 \cdot T/(\rho \cdot \kappa)$, and the dimensionless figures of merit ZT were in the range of 0.9 to 1.3 in all the specimens. Further, the power factor P when the substitution amount r of Sn in the alloy composition of the example 1 is changed is shown in FIG. 8 by comparing it with the relationship of the substitution amount r in the composition of $(Ti_{0.33}Hf_{0.34}Zr_{0.33})_{33}CO_{33}(Sb_{1-r}Sn_r)_{34}$ and the power factor P.

TABLE 1

| | Composition (atomic %) |
|---|---|
| Example 1 | $(Ti_{0.25}Hf_{0.25}Zr_{0.5})_{33}Co_{33}(Sb_{0.85}Sn_{0.15})_{34}$ |
| Example 2 | $(Ti_{0.25}Hf_{0.25}Zr_{0.5})_{30}Co_{35}(Sb_{0.85}Sn_{0.15})_{35}$ |
| Example 3 | $(Ti_{0.25}Hf_{0.25}Zr_{0.5})_{35}Co_{30}(Sb_{0.85}Sn_{0.15})_{35}$ |
| Example 4 | $(Ti_{0.25}Hf_{0.25}Zr_{0.5})_{30}Co_{30}(Sb_{0.85}Sn_{0.15})_{40}$ |
| Example 5 | $(Ti_{0.25}Hf_{0.25}Zr_{0.5})_{35}Co_{35}(Sb_{0.85}Sn_{0.15})_{30}$ |
| Example 6 | $(Ti_{0.3}Hf_{0.2}Zr_{0.5})_{33}Co_{33}(Sb_{0.85}Sn_{0.15})_{34}$ |
| Example 7 | $(Ti_{0.2}Hf_{0.2}Zr_{0.6})_{33}Co_{33}(Sb_{0.85}Sn_{0.15})_{34}$ |
| Example 8 | $(Ti_{0.25}Hf_{0.25}Zr_{0.5})_{35}Co_{35}(Sb_{0.7}Sn_{0.3})_{30}$ |
| Example 9 | $(Ti_{0.25}Hf_{0.25}Zr_{0.5})_{33}Co_{33}(Sb_{0.88}Sn_{0.12})_{34}$ |
| Example 10 | $(Ti_{0.3}Hf_{0.3}Zr_{0.4})_{33}Co_{33}(Sb_{0.85}Sn_{0.15})_{34}$ |
| Example 11 | $(Ti_{0.3}Hf_{0.3}Zr_{0.4})_{33}Co_{33}(Co_{0.7}Ni_{0.3})_{33}(Sb_{0.5}Sn_{0.5})_{34}$ |
| Comparative Example 1 | $(Ti_{0.3}Hf_{0.35}Zr_{0.35})_{33}Co_{33}Sb_{34}$ |
| Comparative Example 2 | $(Ti_{0.3}Hf_{0.35}Zr_{0.35})_{33}Co_{33}(Sb_{0.97}Sn_{0.03})_{34}$ |
| Comparative Example 3 | $(Ti_{0.3}Hf_{0.35}Zr_{0.35})_{33}Co_{33}(Sb_{0.85}Sn_{0.15})_{34}$ |
| Comparative Example 4 | $(Ti_{0.25}Hf_{0.25}Zr_{0.5})_{33}Co_{33}Sb_{34}$ |
| Comparative Example 5 | $(Ti_{0.25}Hf_{0.25}Zr_{0.5})_{33}Co_{33}(Sb_{0.15}Sn_{0.85})_{34}$ |

TABLE 2

| | Seebeck coefficient α (μV/K) | Electric resistivity ρ (mΩcm) | Output factor $α^2/ρ$ (mW/mK$^2$) |
|---|---|---|---|
| Example 1 | 315 | 2.5 | 4.0 |
| Example 2 | 310 | 2.7 | 3.7 |
| Example 3 | 300 | 2.3 | 3.9 |
| Example 4 | 295 | 2.2 | 4.0 |
| Example 5 | 297 | 2.3 | 3.8 |
| Example 6 | 305 | 2.6 | 3.6 |
| Example 7 | 296 | 2.4 | 3.7 |
| Example 8 | 290 | 2.2 | 3.8 |
| Example 9 | 325 | 2.8 | 3.8 |
| Example 10 | 300 | 2.4 | 3.8 |
| Example 11 | 290 | 2.2 | 3.8 |
| Comparative Example 1 | −310 | 12.5 | 0.8 |
| Comparative Example 2 | 150 | 8.5 | 0.3 |
| Comparative Example 3 | 302 | 2.9 | 3.1 |
| Comparative Example 4 | −330 | 18.5 | 0.6 |
| Comparative Example 5 | 85 | 1.2 | 0.6 |

As is obvious from Table 2, it is found out that the thermoelectric materials of the examples 1 to 11 can obtain favorable thermoelectric characteristics as compared with the comparative example 1 and the comparative example 2 of which substitution amount of Sn for Sb is small, after substituting harmless and low-cost Sn for a part of harmful Sb (in the range from over 10 atomic % to 80 atomic % inclusive). As shown in the comparative example 3, sufficient thermoelectric characteristics cannot be obtained by only substituting the effective amount of Sn for Sb. As is obvious from FIG. 8, in the case of applying the Zr-rich composition, the effect of substituting Sn for Sb can be obtained more effectively.

As shown in the comparative example 4, the thermoelectric characteristics reduce by only applying the Zr-rich (Ti, Hf, Zr) composition. This shows that the Zr-rich (Ti, Hf, Zr) composition is effective for the system in which the effective amount of Sn is substituted for Sb. Further, as shown in the comparative example 5, when the substitution amount of Sn for Sb is excessive, the number of valence electrons per one atom significantly deviates from 6 (the number of valence electrons per one atom of the comparative example 5=5.701), and therefore, the thermoelectric characteristics reduce.

EXAMPLES 12 TO 21

As shown in Table 3, the thermoelectric materials were produced similarly to the example 1 except that the composition which was the result of substituting the element M for a part of (Ti, Zr, Hf) of the alloy composition according to the example 1, the composition which was the result of substituting the element T for a part of Co, and the composition which was the result of substituting the element X for a part of (Sb, Sn) were applied. The chip in a desired shape was cut out from each of these molded bodies and was provided for measurement and evaluation of the thermoelectric characteristics as in the example 1. The values are shown in Table 4. As a result of providing each remaining part to the powder X-ray diffraction and examining the generated phase, the diffraction peak mainly derived from the MgAgAs type crystal phase was observed.

TABLE 3

| | (Ti, Zr, Hf) | | Co | | (Sb, Sn) | |
|---|---|---|---|---|---|---|
| | Substituted element | Substitution amount | Substituted element | Substitution amount | Substituted element | Substitution amount |
| Example 12 | V | 0.05 | (none) | — | (none) | — |
| Example 13 | Nb | 0.10 | (none) | — | (none) | — |
| Example 14 | (none) | — | Fe | 0.02 | (none) | — |
| Example 15 | (none) | — | Ni | 0.05 | (none) | — |
| Example 16 | (none) | — | (none) | — | Bi | 0.03 |
| Example 17 | Mo | 0.05 | Fe | 0.13 | (none) | — |
| Example 18 | (none) | — | Ni | 0.05 | Ge | 0.02 |
| Example 19 | W | 0.03 | (none) | — | Bi | 0.01 |
| Example 20 | Y | 0.03 | Ni | 0.08 | Bi | 0.02 |
| Example 21 | Nb, Gd | 0.02, 0.03 | Fe | 0.02 | (none) | — |

TABLE 4

| | Seebeck coefficient α (μV/K) | Electric resistivity ρ (mΩcm) | Output factor α²/ρ (mW/mK²) |
|---|---|---|---|
| Example 12 | 325 | 2.6 | 4.1 |
| Example 13 | 322 | 2.6 | 4.0 |
| Example 14 | 313 | 2.5 | 3.9 |
| Example 15 | 305 | 2.4 | 3.9 |
| Example 16 | 300 | 2.2 | 4.1 |
| Example 17 | 310 | 2.7 | 3.7 |
| Example 18 | 300 | 2.4 | 3.8 |
| Example 19 | 310 | 2.4 | 4.0 |
| Example 20 | 290 | 2.1 | 4.0 |
| Example 21 | 293 | 2.2 | 3.9 |

Next, by using each of the thermoelectric materials of the above described examples 1 to 21 was used as the p-type thermoelectric material, the thermoelectric conversion module of which structure was shown in FIG. 4 was produced. For the n-type thermoelectric material, the (Ti, Zr, Hf)—Ni—(Sn, Sb) type Half-Heusler material was used. When the temperature difference of 500° C. was given to the upper and lower surfaces of each of such thermoelectric conversion modules, and the power generation characteristics were measured and evaluated, the thermoelectric conversion module of each of the examples was able to obtain large electric output of 22 to 35 W. On the other hand, in the thermoelectric conversion module using the thermoelectric material of the comparative example 3 as the p-type thermoelectric material, the electric output of only 17 W was obtained.

The present invention is not limited to the above described embodiments, and may be variously modified in the range departing from the spirit of the invention in the stage of being carried out. Further, each of the embodiments can be carried out by being properly combined as much as possible, and in this case, the combined effect can be obtained. Further, the above described embodiments include the invention at the various stages, and various inventions can be extracted by proper combination in a plurality of disclosed features.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thermoelectric material comprising a composition expressed by a composition formula:

$$(Ti_p Hf_q Zr_{1-p-q})_x Co_y (Sb_{1-r} Sn_r)_{100-x-y}$$

where, p is a value satisfying $0.2 \leq p \leq 0.3$, q is a value satisfying $0.2 \leq q \leq 0.3$, r is a value satisfying $0.1 < r \leq 0.8$, x is a value satisfying $30 \leq x \leq 35$ atomic %, and y is a value satisfying $30 \leq y \leq 35$ atomic %, wherein the thermoelectric material includes a phase having an MgAgAs crystal structure as a main phase, and has a Seebeck coefficient α at 700K of 290 μV/K or more and an electric resistivity ρ at 700K of 2.8 mΩcm or less.

2. The material according to claim 1, wherein the value r satisfies $0.1 < r \leq 0.5$.

3. The material according to claim 1, wherein the value r satisfies $0.1 < r \leq 0.3$.

4. The material according to claim 1, wherein a part of a total amount of the Ti (titanium), Zr (zirconium) and Hf (hafnium) is replaced by at least one element selected from V (vanadium), Nb (niobium), Ta (tantalum), Cr (chromium), Mo (molybdenum), W (tungsten), Sc (scandium), Y (yttrium), U (uranium) and a lanthanoid element.

5. The material according to claim 1, wherein a part of the Co (cobalt) is replaced by at least one element selected from Mn (manganese), Fe (iron), Ni (nickel), Cu (copper), Ag (silver), Pd (palladium), Pt (platinum), Ru (ruthenium) and Os (osmium).

6. The material according to claim 1, wherein a part of a total amount of the Sb (antimony) and Sn (tin) is replaced by at least one selected from Bi (bismuth), Pb (lead), Se (selenium), Te (tellurium) and Ge (germanium).

7. The material according to claim 1, wherein a part of a total amount of the Sb (antimony) and Sn (tin) is replaced by at least one selected from Bi (bismuth) and Ge (germanium).

8. The material according to claim 1, wherein the thermoelectric material is a p-type thermoelectric material.

9. The material according to claim 1, wherein a power factor P at 700K of the thermoelectric material is 3.6 mW/mK² or more, where the power factor P is obtained from the Seebeck coefficient α at 700K and the electric resistivity ρ at 700K by a formula α²/ρ.

10. A thermoelectric conversion module, comprising:
a first electrode;
a p-type thermoelectric element with one end connected to the first electrode;
a second electrode connected to the other end of the p-type thermoelectric element;
an n-type thermoelectric element with one end connected to the second electrode; and
a third electrode connected to the other end of the n-type thermoelectric element, wherein
at least one of the p-type thermoelectric element and the n-type thermoelectric element is composed of a thermoelectric material comprising a composition expressed by a composition formula:

$$(Ti_p Hf_q Zr_{1-p-q})_x Co_y (Sb_{1-r} Sn_r)_{100-x-y}$$

where, p is a value satisfying $0.2 \leq p \leq 0.3$, q is a value satisfying $0.2 \leq q \leq 0.3$, r is a value satisfying $0.1 < r \leq 0.8$, x is a value satisfying $30 \leq x \leq 35$ atomic %, and y is a value satisfying $30 \leq y \leq 35$ atomic %, and wherein the thermoelectric material includes a phase having an MgAgAs crystal structure as a main phase, and has a Seebeck coefficient α at 700K of 290 μV/K or more and an electric resistivity ρ at 700K of 2.8 mΩcm or less.

11. The module according to claim 10, wherein the value r satisfies $0.1 < r \leq 0.5$.

12. The module according to claim 10, wherein a part of a total amount of the Ti (titanium), Zr (zirconium) and Hf (hafnium) is replaced by at least one element selected from V (vanadium), Nb (niobium), Ta (tantalum), Cr (chromium), Mo (molybdenum), W (tungsten), Sc (scandium), Y (yttrium), U (uranium) and a lanthanoid element.

13. The module according to claim 10, wherein a part of the Co (cobalt) is replaced by at least one element selected from Mn (manganese), Fe (iron), Ni (nickel), Cu (copper), Ag (silver), Pd (palladium), Pt (platinum), Ru (ruthenium) and Os (osmium).

14. The module according to claim 10, wherein a part of a total amount of the Sb (antimony) and Sn (tin) is replaced by at least one element selected from Bi (bismuth), Pb (lead), Se (selenium), Te (tellurium) and Ge (germanium).

15. The module according to claim 10, wherein the p-type thermoelectric element is composed of the thermoelectric material.

16. The module according to claim 10, wherein the p-type thermoelectric element comprises a plurality of p-type thermoelectric elements and the n-type thermoelectric element comprises a plurality of n-type thermoelectric elements, and the plurality of p-type thermoelectric elements and the plurality of n-type thermoelectric elements are alternately disposed and connected in series with the first, second and third electrodes.

17. The module according to claim 10, wherein a power factor P at 700K of the thermoelectric material is 3.6 mW/mK$^2$ or more, where the power factor P is obtained from the Seebeck coefficient $\alpha$ at 700K and the electric resistivity $\rho$ at 700K by a formula $\alpha^2/\rho$.

18. A thermoelectric power generating device, comprising:
a high-temperature portion;
a low-temperature portion; and
the thermoelectric conversion module according to claim 10 and disposed between the high-temperature portion and the low-temperature portion, wherein
heat of the high-temperature portion is converted into electric power by the thermoelectric conversion module.

19. The device according to claim 18, wherein the high-temperature portion includes a flow path for a high-temperature fluid, and the low-temperature portion includes a flow path for a cooling medium.

* * * * *